US009536991B1

(12) United States Patent
Zang et al.

(10) Patent No.: US 9,536,991 B1
(45) Date of Patent: Jan. 3, 2017

(54) SINGLE DIFFUSION BREAK STRUCTURE

(71) Applicant: GLOBALFOUNDRIES Inc., Grand Cayman (KY)

(72) Inventors: Hui Zang, Guilderland, NY (US); Jerome Ciavatti, Mechanicville, NY (US); Min-hwa Chi, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/067,435

(22) Filed: Mar. 11, 2016

(51) Int. Cl.
*H01L 27/088* (2006.01)
*H01L 29/06* (2006.01)
*H01L 29/66* (2006.01)
*H01L 21/8234* (2006.01)
*H01L 21/762* (2006.01)

(52) U.S. Cl.
CPC ..... *H01L 29/6681* (2013.01); *H01L 21/76224* (2013.01); *H01L 21/823431* (2013.01); *H01L 21/823481* (2013.01); *H01L 27/0886* (2013.01); *H01L 29/0653* (2013.01)

(58) Field of Classification Search
None
See application file for complete search history.

(56) References Cited

U.S. PATENT DOCUMENTS

| 8,105,893 B2 | 1/2012 | Guo et al. |
| 8,916,460 B1 | 12/2014 | Kwon et al. |
| 2015/0054089 A1* | 2/2015 | Hong ................. H01L 27/0886 257/401 |
| 2015/0115373 A1* | 4/2015 | Yu .................... H01L 21/82341 257/401 |

OTHER PUBLICATIONS

U.S. Appl. No. 15/067,455, filed Mar. 11, 2016, titled Single Diffusion Break Structure and Cuts Later Method of Making.

* cited by examiner

*Primary Examiner* — Khaja Ahmad
(74) *Attorney, Agent, or Firm* — Heslin Rothenberg Farley & Mesiti P.C.

(57) ABSTRACT

A method of forming a single diffusion break includes patterning a fin hardmask disposed over a substrate. First and second fin arrays separated by an isolation region are etched into the substrate from the patterned fin hardmask. Any remaining fin hardmask being self-aligned with the fins. A first dielectric fill material is disposed and planarized over the arrays to expose top surfaces of the remaining fin hardmask. A second dielectric strip is formed over the first dielectric fill material to cover the isolation region and end portions of the remaining fin hardmask. Any exposed portions of the remaining fin hardmask are anisotropically etched away. The end portions of the remaining fin hardmask form base extensions of a base for a single diffusion break (SDB) in the isolation region. The first dielectric fill material and second dielectric strip are etched to complete formation of the base for the single diffusion break.

10 Claims, 13 Drawing Sheets

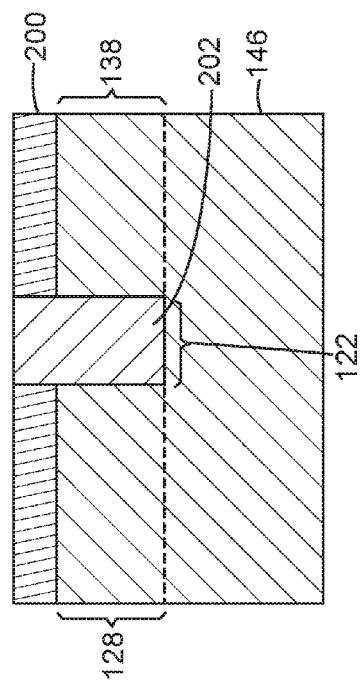
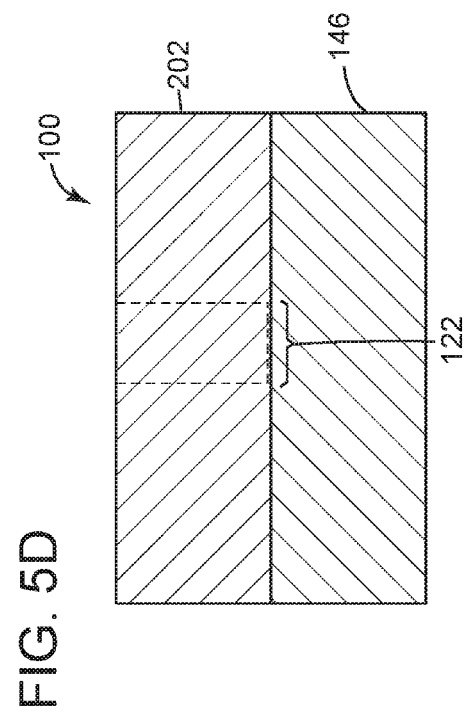
FIG. 5C
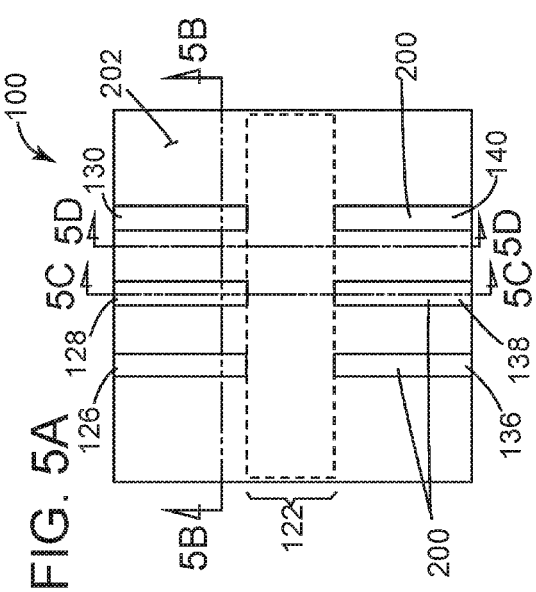
FIG. 5D
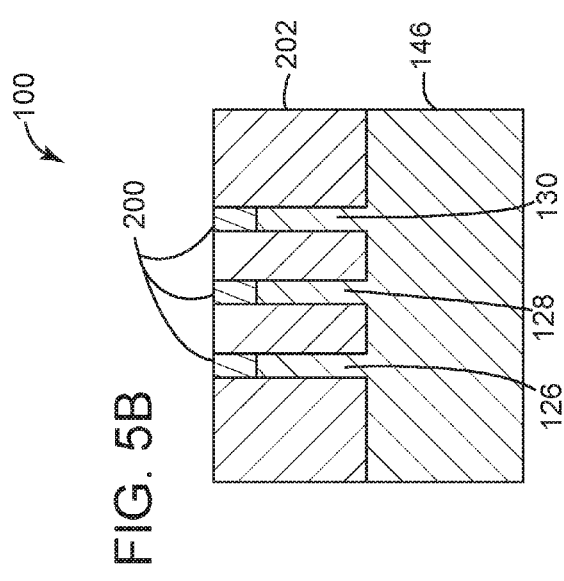
FIG. 5B
FIG. 5A

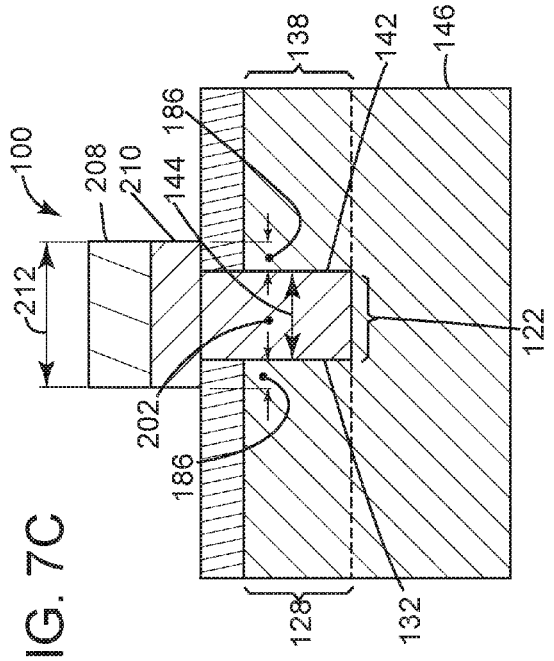
FIG. 7C
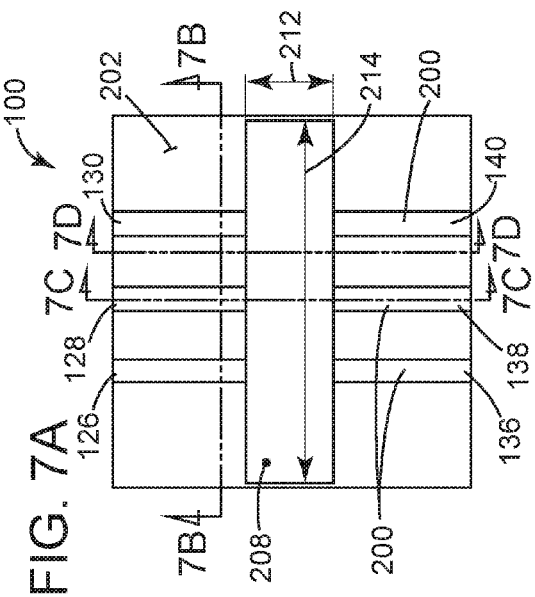
FIG. 7D
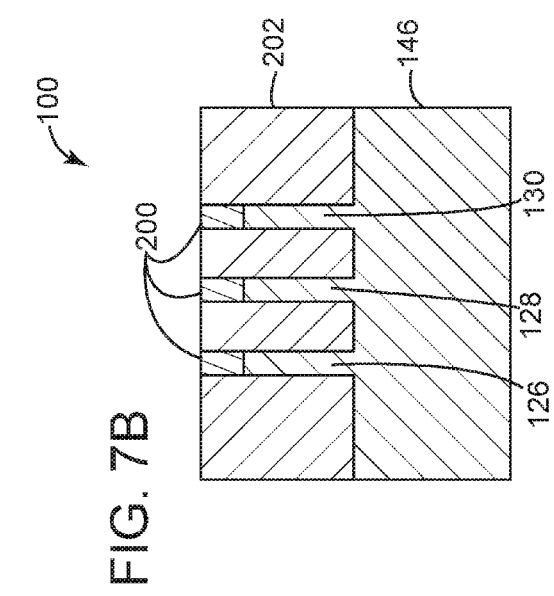
FIG. 7B
FIG. 7A

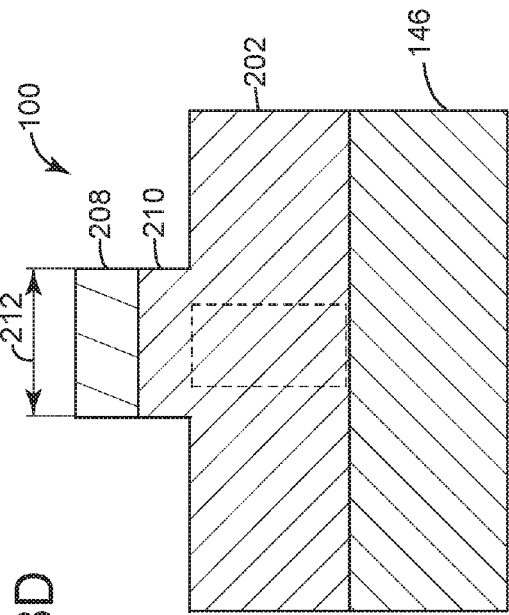
FIG. 8C
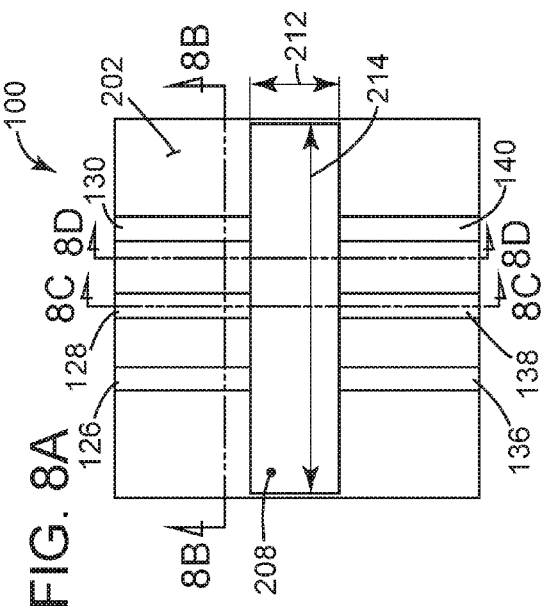
FIG. 8D
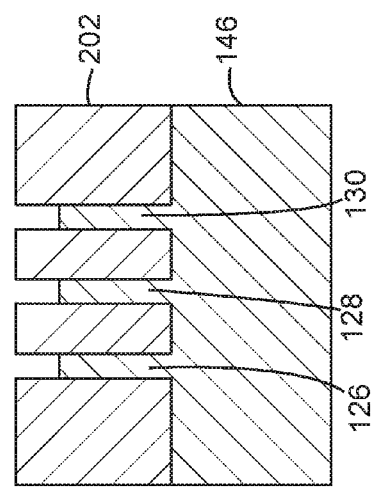
FIG. 8B
FIG. 8A

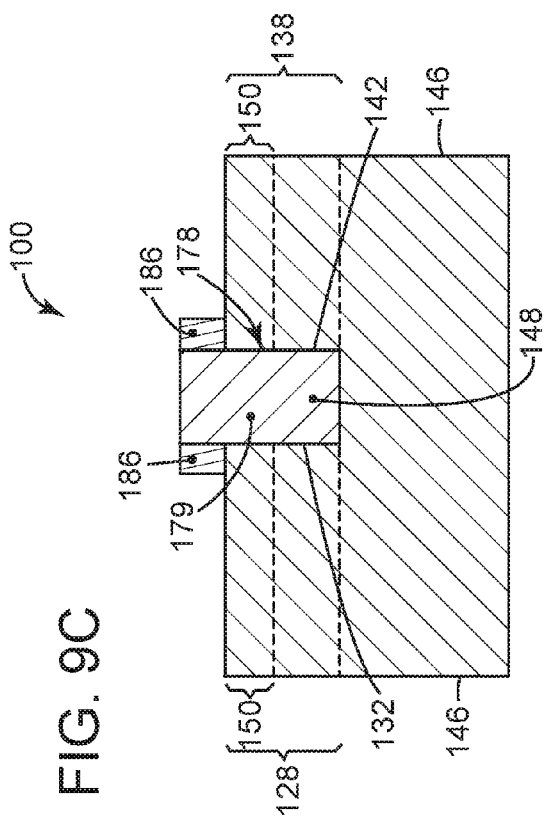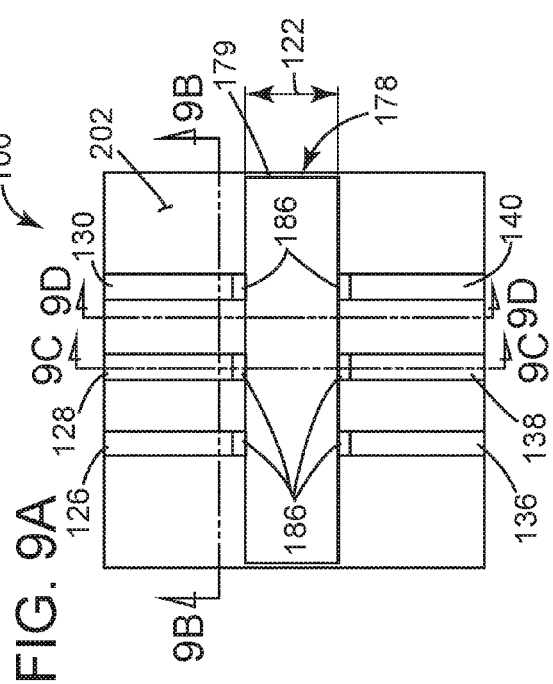

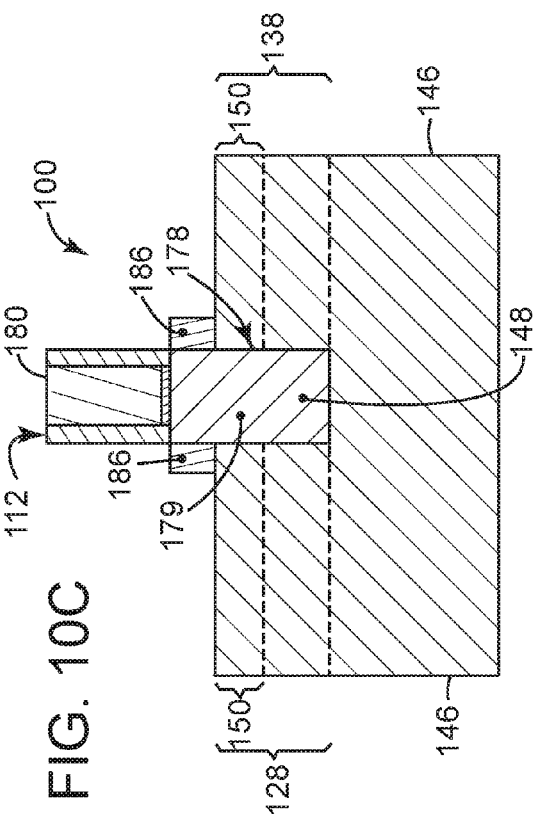
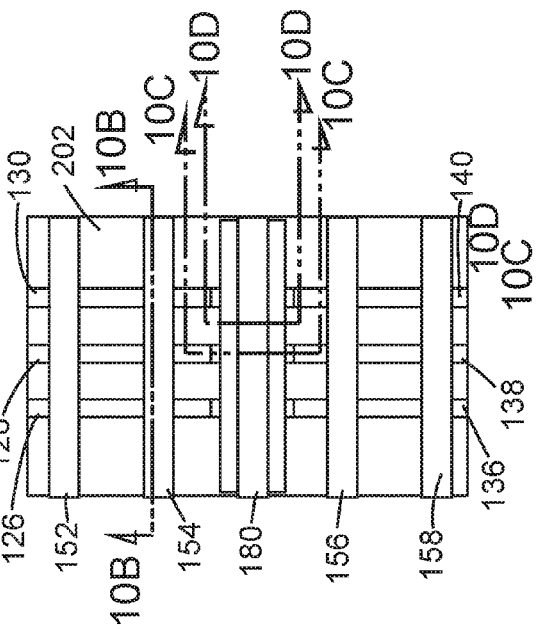
FIG. 10C
FIG. 10D
FIG. 10B
FIG. 10A

SINGLE DIFFUSION BREAK STRUCTURE

TECHNICAL FIELD

The present invention relates to semiconductor devices and methods of fabricating the same. More specifically, the invention relates to single diffusion break structures and methods of making the same.

BACKGROUND

With constant down-scaling and increasingly demanding requirements to the speed and functionality of ultra-high density integrated circuits, semiconductor devices, such as transistors, diodes, capacitors and the like, need to continuously reduce space between active (Rx) regions on a semiconductor substrate. More specifically, as integrated circuits are scaled down, the shallow trench isolation (STI) regions used to electrically isolate Rx regions must also be scaled down.

Conventionally, multiple Rx regions in a semiconductor integrated circuit typically include arrays of parallel extending fins having distal ends abutting the edges of each Rx region. By way of example, this is particularly the case for FinFET technology at the 14 nm node and beyond. The fin arrays are terminated by dummy gates, which extend laterally across the distal ends of the fins at the edges of the Rx regions. The dummy gates are used to induce symmetrical epitaxial growth of source/drain regions (S/D regions) on the end portions of the fins located between the dummy gates and adjacent active gates.

Also conventionally, the multiple Rx regions are separated by isolation regions, such as STI regions, that are typically composed of an amorphous dielectric material, such as a flowable oxide (FOX), and have a width of about 70 to 80 nanometers (nm). There can be many thousands to millions of such isolation regions providing electrical isolation between the many Rx regions in a typical ultra-high density integrated circuit.

However, as integrated circuits are scaled down to such class sizes as 14 nm node or beyond, the width of a conventional isolation region becomes increasingly problematic as a region devoid of active devices. Therefore, in an effort to reduce the width of prior art isolation regions, single dummy gates disposed within such isolation regions that can terminate two opposing fin arrays (i.e., fin-ends to fin-ends) between adjacent Rx regions have been developed. These specially designed dummy gates on isolation structure are known as Single Diffusion Breaks (SDB) and reduce the distance between Rx regions, that is the distance between fin array edges or fin-ends, i.e., the width of an isolation region, to about 30 nm.

However the formation of prior art SDBs problematically require extra masking, deposition and etching steps. Additionally, the process of making such SDBs are sensitive to lithographic alignment tolerances, which limit their scalability.

Moreover, the structure of prior art SDBs limits the epitaxial growth of the S/D regions abutting the SDB, resulting in S/D regions having a smaller epitaxial volume and electrical contact area compared to that of S/D regions located between active gates. The smaller S/D region volume and contact area can lead to greater contact resistance and degrade device performance.

Accordingly, there is a need for an SDB structure, and method of making the same, which is not as sensitive to lithographic alignment issues. Further there is a need for an SDB structure and method, which does not limit adjacently located S/D region epitaxial volume and contact area compared to other S/D regions located between active gates. Additionally, there is a need for an SDB structure and method, which can be scaled for the 14 nm node and beyond.

BRIEF DESCRIPTION

The present invention offers advantages and alternatives over the prior art by providing a structure having an SDB and method of making the same wherein the SDB is less sensitive to lithographic alignment issues. Further the S/D regions adjacent the SDB are substantially equal in volume to S/D regions between pairs of active gates. Additionally, the SDB structure can be scaled down to the 14 nm node and beyond.

A method of making a structure having a single diffusion break in accordance with one or more aspects of the present invention includes patterning a fin hardmask disposed over a substrate. First and second fin arrays separated by an isolation region are anisotropically etched into the substrate from the patterned fin hardmask. Any portions of fin hardmask which remain after etching are self-aligned with the fins of the arrays. A first dielectric fill material is disposed and planarized over the fin arrays to expose top surfaces of the remaining fin hardmask. A second dielectric strip is formed over the first dielectric fill material to cover the isolation region and end portions of the remaining fin hardmask. Any exposed portions of the remaining fin hardmask are anisotropically etched away such that the end portions of the remaining fin hardmask covered by the strip form base extensions of a base for a single diffusion break (SDB) in the isolation region. The first dielectric fill material and second dielectric strip are isotropically etched to expose the base extensions and complete formation of the base for the single diffusion break.

A structure having a single diffusion break in accordance with one or more aspects of the present invention includes a substrate and a dielectric layer disposed over the substrate. A first array of fins having first distal ends and a second array of fins having second distal ends extend upwards from the substrate through the dielectric layer. An isolation region separates the first and second array of fins wherein the first and second distal ends abut opposing sides of the isolation region. A single diffusion break (SDB) is disposed in the isolation region. The SDB has a base. The base has a base raised portion extending upwards from the dielectric layer and a plurality of base extensions extending solely over top surfaces of fin end portions of the fins abutting the isolation region. The base extensions are self-aligned with edges of the fin end portions. A dummy gate is disposed over a top of the base.

DRAWINGS

The invention will be more fully understood from the following detailed description taken in conjunction with the accompanying drawings, in which:

FIG. 5A is a top view of an exemplary embodiment of the structure of FIG. 4 having a first dielectric fill material 202 disposed thereon;

FIG. 5B is a cross sectional view of FIG. 5A taken along the line 5B-5B;

FIG. 5C is a cross sectional view of FIG. 5A taken along the line 5C-5C;

FIG. 5D is a cross sectional view of FIG. 5A taken along the line 5D-5D;

FIG. 7A is a top view of an exemplary embodiment of the structure of FIG. 6A after the second dielectric fill material and the photoresist layer have been lithographically patterned to form a second dielectric strip and a photo resist strip respectively;

FIG. 7B is a cross sectional view of FIG. 7A taken along the line 7B-7B;

FIG. 7C is a cross sectional view of FIG. 7A taken along the line 7C-7C;

FIG. 7D is a cross sectional view of FIG. 7A taken along the line 7D-7D;

FIG. 8A is a top view of an exemplary embodiment of the structure of FIG. 7A after a fin hardmask has been removed;

FIG. 8B is a cross sectional view of FIG. 8A taken along the line 8B-8B;

FIG. 8C is a cross sectional view of FIG. 8A taken along the line 8C-8C;

FIG. 8D is a cross sectional view of FIG. 8A taken along the line 8D-8D;

FIG. 9A is a top view of an exemplary embodiment of the structure of FIG. 8A after an isotropic etching process to expose active portion of the fins and to complete formation of a base for the SDB;

FIG. 9B is a cross sectional view of FIG. 9A taken along the line 9B-9B;

FIG. 9C is a cross sectional view of FIG. 9A taken along the line 9C-9C;

FIG. 9D is a cross sectional view of FIG. 9A taken along the line 9D-9D;

FIG. 10A is a top view of an exemplary embodiment of the structure of FIG. 9A after a dummy gate is disposed over the base to complete formations of the SDB;

FIG. 10B is a cross sectional view of FIG. 10A taken along the line 10B-10B;

FIG. 10C is a cross sectional view of FIG. 10A taken along the line 10C-10C; and FIG. 10D is a cross sectional view of FIG. 10A taken along the line 10D-10D.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Figure 1A:
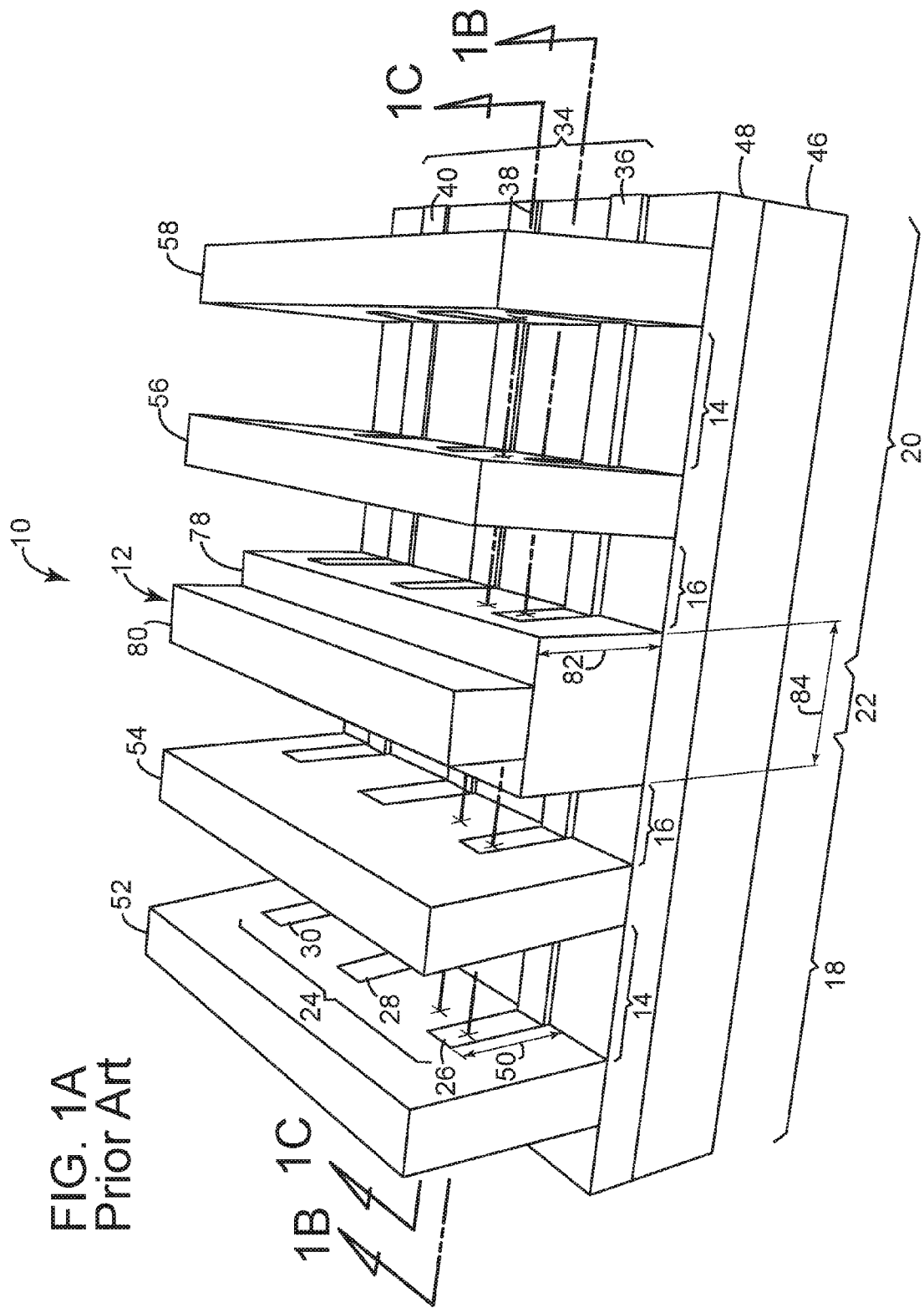
FIG. 1A is a perspective view of an exemplary embodiment of a structure for an integrated circuit having a prior art single diffusion break (SDB) just prior to initiation of epitaxial growth within source/drain (S/D) regions.
Figure 1B:
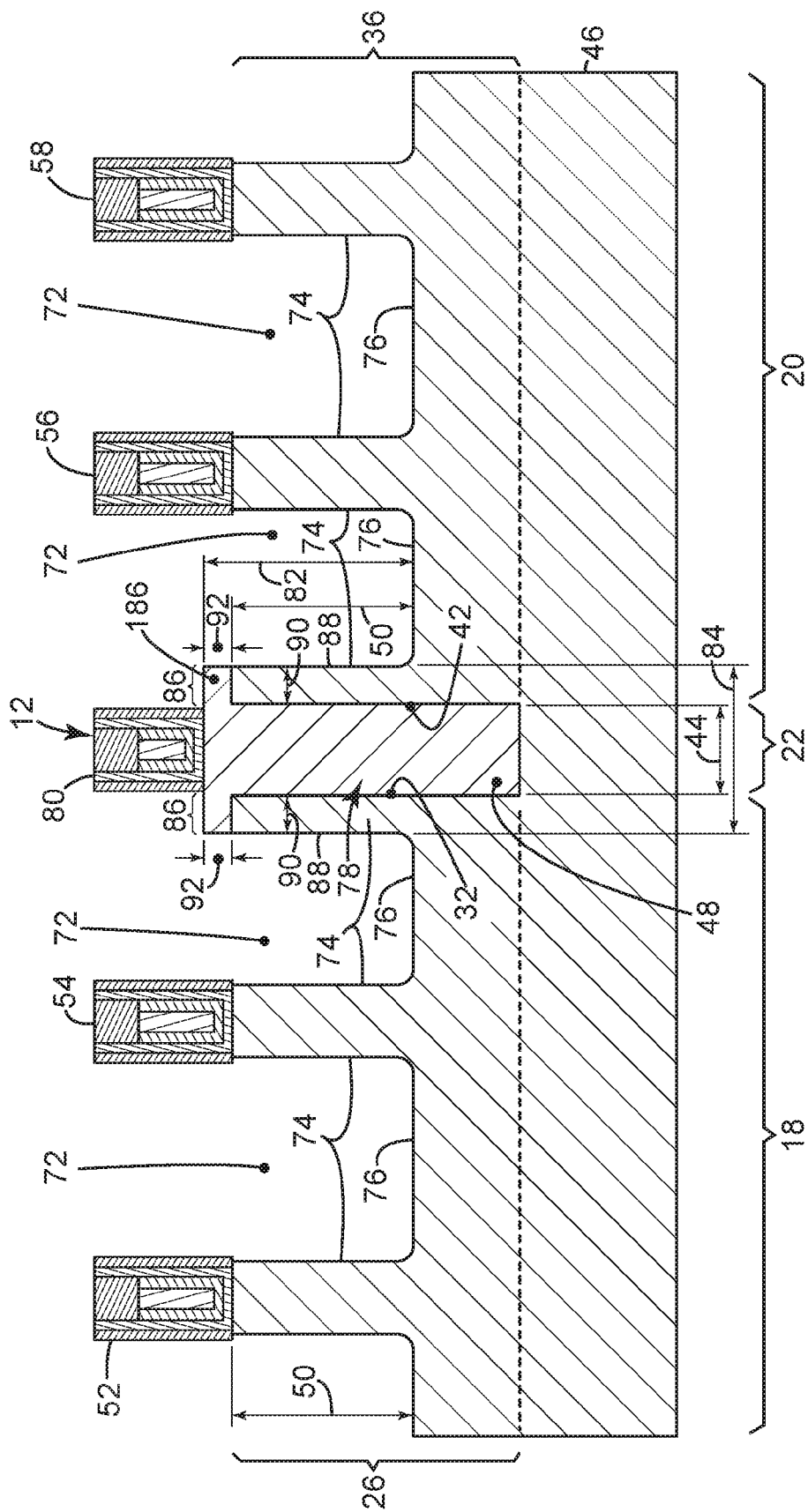
FIG. 1B is a cross sectional view of FIG. 1A taken along the line 1B-1B.
Figure 1C:
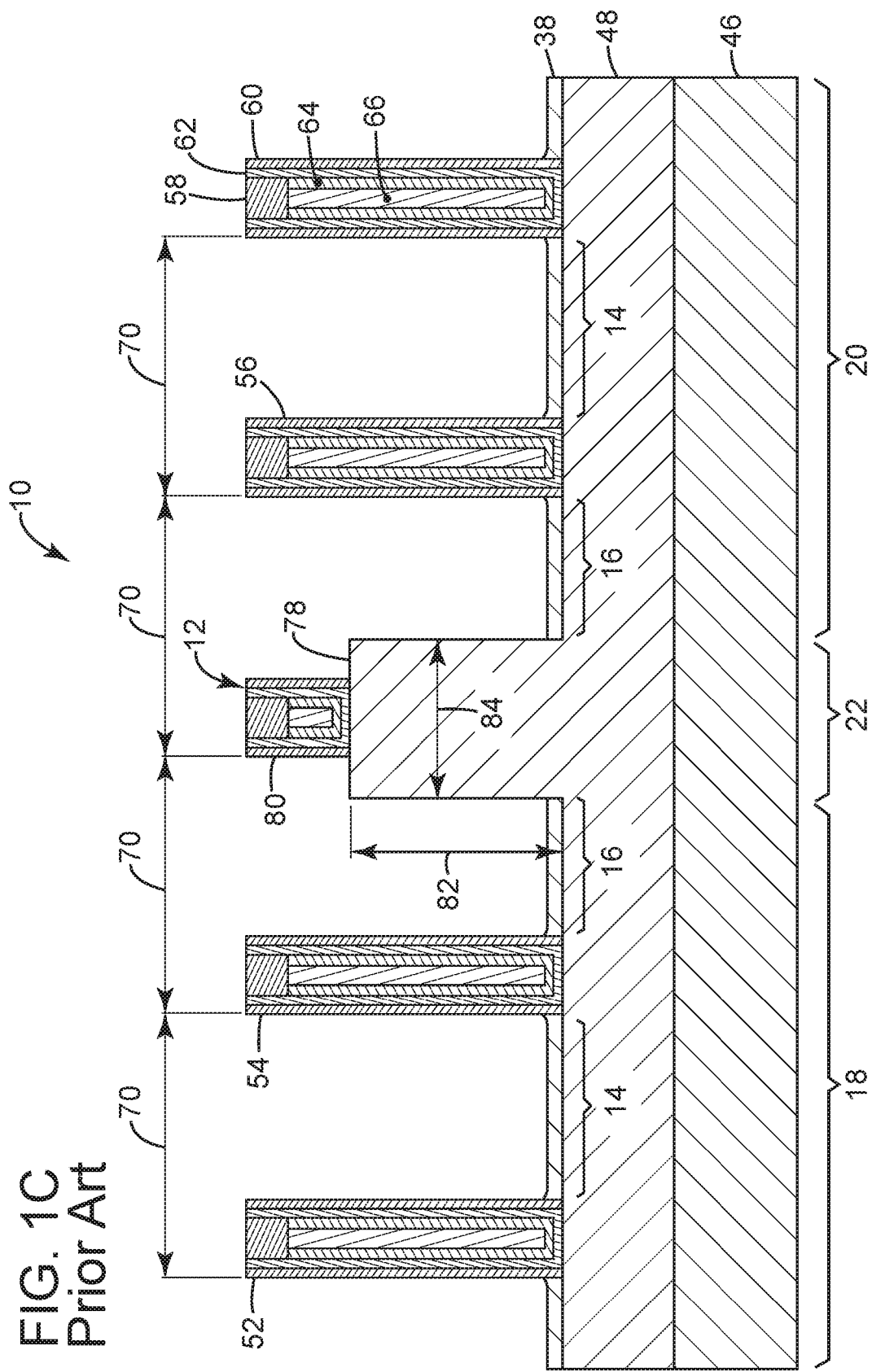
FIG. 1C is a cross sectional view of FIG. 1A taken along the line 1C-1C.

Referring to FIGS. 1A, 1B and 1C, an exemplary embodiment of a structure 10 for an integrated circuit formed utilizing FinFET technology and having a prior art single diffusion break (SDB) 12 is presented. FIG. 1A is a perspective view of structure 10 at an intermediate stage of its manufacturing process, just prior to initiation of epitaxial growth within source/drain (S/D) regions 14 and 16. FIG. 1B is a cross sectional view of FIG. 1A taken along the line 1B-1B, which cuts through fins 26 and 36. FIG. 1C is a cross sectional view of FIG. 1A taken along the line 1C-1C, which cuts a region between the parallel rows of fins.

Structure 10 includes a pair of opposing active Rx regions 18 and 20, which are separated by an isolation region 22. In this embodiment isolation region 22 is illustrated as a shallow trench isolation (STI) region. Disposed within and around the isolation region 22 is SDB 12, which electrically isolates the Rx regions 18 and 20. A first array 24 of parallel fins 26, 28 and 30 extends longitudinally across Rx region 18 and is terminated by SDB 12 at distal ends 32 (best seen in FIG. 1B) of the fins 26, 28, 30. A second array 34 of parallel fins 36, 38, 40 extends longitudinally across Rx region 20 and is also terminated by SDB 12 at distal ends 42 (best seen in FIG. 1B) of the fins 36, 38, 40. Though three fins in each Rx region are illustrated in this embodiment, one skilled in the art would recognize that any number of fins can be in each array.

The isolation region 22 has an isolation region width 44 (best seen in FIG. 1B) that is equal to the shortest distance between distal ends 32 (in Rx region 18) and distal ends 42 (in Rx region 20). The isolation width 44 is designed to prevent leakage current between S/D regions 16 and is typically in the range of 25 to 35 nm wide. Typically, as illustrated in this embodiment, the isolation region width 44 is constant along the entire length of isolation region 22.

The fins 26, 28, 30, 36, 38 and 40 extend upwards from a semiconductor substrate 46 and through a dielectric layer 48, which is disposed over the semiconductor substrate 46. The dielectric layer may be composed of an amorphous flowable oxide or the like. The distance the fins extend above the dielectric layer 48 defines the active height 50 of the fins.

Disposed on the dielectric layer 48 and extending laterally over the first fin array 24 are active gates 52 and 54. Disposed on the dielectric layer 48 and extending laterally over the second fin array 34 are active gates 56 and 58. Gates 52, 54, 56 and 58 are representative of any number of gates that extend laterally across each fin array 24 and 34.

As will be explained in greater detail herein, S/D regions 14 and 16 do not necessarily have the same geometric shape or volume because they are bounded by different structures. S/D regions 14 are bounded between two active gates, and centered over each fin extending through the pair of active gates. Therefore, in this embodiment, there are three S/D regions 14 bounded between active gate pair 52 and 54, which are centered over fins 26, 28 and 30. Additionally, there are three S/D regions 14 bounded between active gate pair 56 and 58, which are centered over fins 36, 38 and 40.

By contrast, S/D regions 16 are bounded between an active gate and the SDB 12, and are centered over each fin extending therethrough. As such, in this embodiment, there are three S/D regions 16 bounded between active gate 54 and SDB 12, which are centered over fins 26, 28 and 30. Additionally, there are three S/D regions 16 bounded between active gate 56 and SDB 12, which are centered over fins 36, 38 and 40.

The structure of the gates 52-58 (as illustrated in FIGS. 1B and 1C) is well known, which typically includes gate spacers 60, gate dielectric 62, gate work-function metal 64 and gate interconnect metal 66. Gates 52-58 wrap around three surfaces of each fin to define a channel region 68 between each S/D region 14, 16. It is important to note that, for optimal performance, the pitch 70 (the distance between repetitive structures) between gates 52-58 and the dummy gate SDB 12, must remain constant. This is because the pitch 70 between gates 52-58 and SDB 12 defines the limits of the epitaxial growth of the S/D regions 14, 16 and for optimal performance, the S/D regions must have substantially equal volumes and be symmetrically shaped.

The S/D regions 14, 16 include the portions of the fins 26, 28, 30, 36, 38 and 40 located between the gates 52-58 and SDB 12. At this stage of the process flow, the active portions of the fins in the S/D regions 14, 16 have been etched down to provide a plurality of generally U shaped, three sided trenches 72. That is, trenches 72 will have two generally vertically extending sides 74 and a bottom side 76. The silicon surfaces of the three sides of trenches 72 provide seeding surfaces for epitaxial growth that will define the total volume of the S/D regions 14, 16.

Prior art SDB 12 includes a base 78 and a dummy gate 80 disposed over the top surface of the base 78. Base 78 is generally T-shaped in the regions where the base 78 abuts the distal ends 32, 42 of the fins (best seen in FIG. 1B) and generally rectangular shaped in the regions between the parallel rows of fins (best seen in FIG. 1C). Base 78 is located between the Rx regions 18 and 20, and is composed of a dielectric material, which is typically the same material as that of the dielectric layer 48. For proper functionality, the base 78 must have an overall height 82 that is greater than the active fin height 50 (best seen in FIG. 1B). Additionally, the base must have an overall width 84 that is greater than the isolation region width 44 in both the regions where the base 78 abuts the distal ends of the fins 32, 42 (best seen in FIG. 1B) and in the regions between the parallel rows of fins (best seen in FIG. 1C).

This is because (best seen in FIG. 1B), in the regions where the base 78 abuts the fins 26, 28, 30, 36, 38, 40, the base 78 must include a pair of base extensions 86, which tuck over (or extend and cover over) the tops of each end portion 88 of each fin. The base extensions 86 have an extension length 90 and an extension thickness 92.

The extension length 90 of the base extensions 86 must be long enough to protect the fin end portion 88 when the trenches 72 are being etched into the fins. In other words, if base extensions 86 do not tuck over fin end portions 88, then the entire active portions of the fins (up to and including the distal ends 32 and 42 of the fins) in the S/D regions 16 will be etched away during trench 72 formation. Therefore, trenches 72 will only have two silicon seeding surfaces (i.e., a bottom side silicon surface 76 and only a single vertical side silicon surface 74 adjacent the active gates 54 and 56. The vertical side silicon surface 74 that is an integral part of fin end portions 88 will be gone, which will drastically impair epitaxial growth in S/D region 16.

The extension thickness 92 of the base extensions 86 must be wide enough to prevent leakage current from the S/D regions 16 into the dummy gate 80 of SDB 12. This leakage current can occur even though SDB dummy gate 80 is non-functional since it is not disposed over any fins and cannot control current flow through any channel region of an active device. That is because the structure of SDB dummy gate is the same as active gates 52, 54, 56 and 58. Accordingly, the dummy gate 80 will typically include spacers 60, dielectric 62, work-function metal 64 and interconnect metal 66. As a result, it is possible for a leakage current or tunneling current to conduct from the S/D regions 16 into dummy gate 80 if the extension width 92 is not sized properly thick enough.

A typical prior art method of making the SDB 12 is to first deposit a thick layer of dielectric material, such as flowable oxide material (not shown), over the entire substrate 46, including the entirety of Rx regions 18, 20 and the predetermined location of SDB 12. The dielectric material may then be planarized down to the height 82 of base 78. A photo resist strip (not shown) can then be patterned over the dielectric material such that it defines the location and boundaries of the base 78. The exposed portion of the dielectric material can then be etched down to form dielectric layer 48, while the portion of the dielectric material protected by the photo resist strip becomes the base 78. The SDB dummy gate 80 can then be disposed over the top of the base 78 to complete the formation of SDB 12.

However, there are several problematic issues associated with the structure and method of making prior art SDB 12, especially in the smaller class sizes such as 14 nm and lower. For example, due to lithographic tolerance issues, it is difficult to center base 78 such that its base extensions 86 tuck over and cover the fin end portions 88 in both Rx regions 18 and 20 equally and symmetrically. If the tuck (or cover) over the fin end portions 88 in Rx region 18 is much different than that of the Rx region 20, transistor and system performance will be degraded. This issue becomes exacerbated by the fact that the overall width 84 of the base 78 must be large enough to accept the lithographic tolerances of disposing the SDB dummy gate 80 over the top of base 78 but not so large as to significantly reduce the size of the trenches 72 in S/D regions 16 (adjacent SDB 12) relative to trenches 72 located in S/D regions 14 (between the active gates 52, 54, 56 and 58).

Just as problematically, it is extremely difficult, if not impossible, to lithographically pattern extensions 86 of base 78 into a photo resist strip so that the extensions 86 are disposed accurately and solely over the narrow widths (generally in the range of about 10 nm) of fin end portions 88 of every fin. Being able to dispose extensions 86 solely over the fins end portions 88 would be advantageous because the extensions 86 only have to protect the fin end portions 88 when the trenches 72 are being etched into the fins, and serve no useful purpose if they cover any area between the fins.

As a result of these lithographic limitations, the overall width 84 of base 78 (best seen in FIG. 1C) must be made larger than functionally required between the fins in order to assure that the base 78 will always cover the fin end portions 88 when the trenches 72 are etched. That is, in the regions over the fins where the extensions 86 are required (FIG. 1B) and in the regions between the fins where the extensions 86 are not required (FIG. 1C), the overall width 84 of base 78 must be made equal to the isolation region width 44 (i.e., the distance between distal ends 32 and 42 of the fins) plus the length 90 of each pair of opposing extensions 86.

Unfortunately, the larger than required base width 84 between the fins (FIG. 1C) unnecessarily sacrifices volume of the S/D regions 16 which abut the base 78 and limits epitaxial growth within S/D regions 16 relative to S/D regions 14. This issue of the base 78 being unnecessarily wide in the regions between the fins becomes proportionally more significant in smaller FinFET nodes, such as 14 nm or beyond, and severely limits the scalability of this prior art design.

Figure 2A:
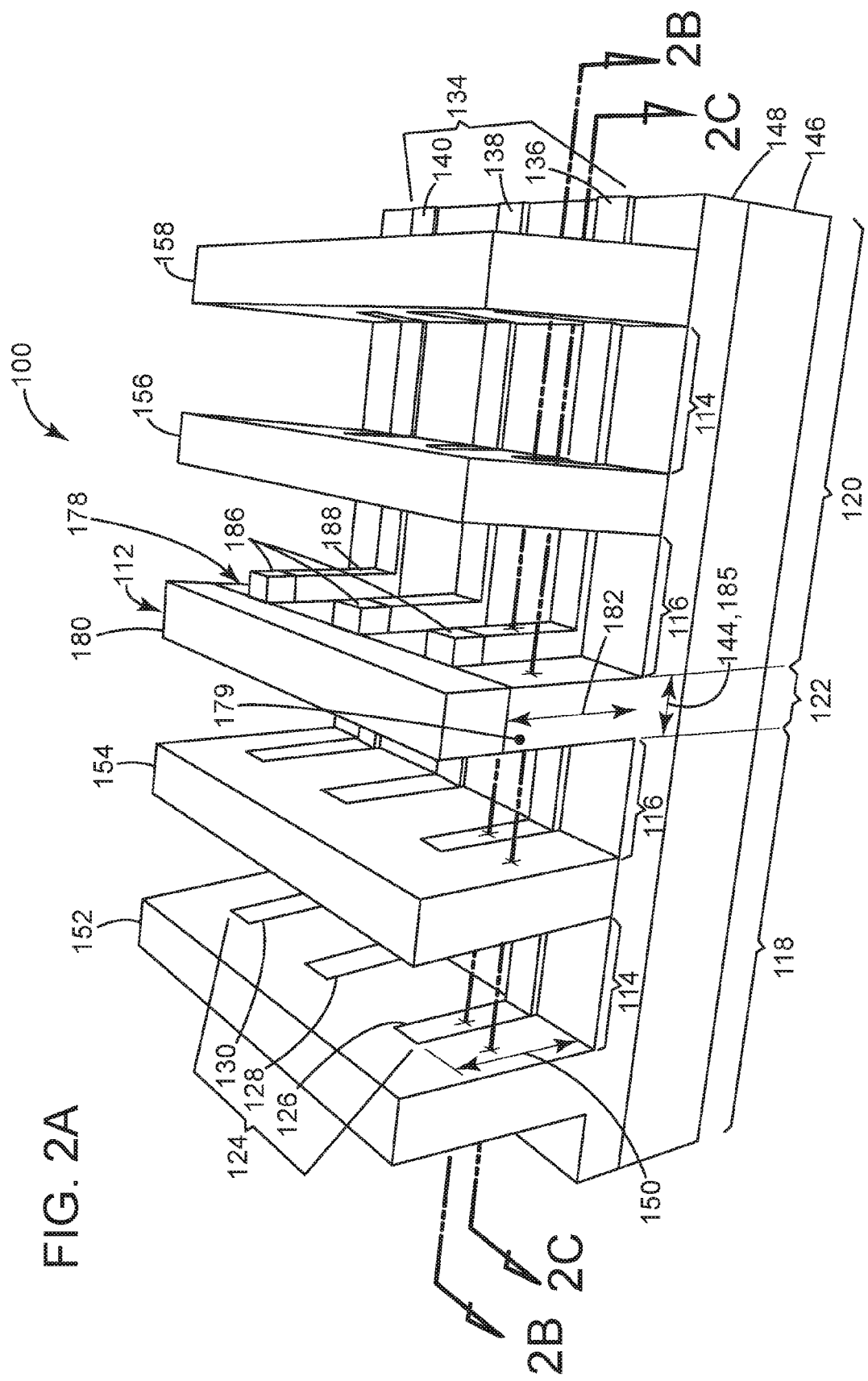
FIG. 2A is a perspective view of an exemplary embodiment of a structure for an integrated circuit having a substrate with an SDB just prior to initiation of epitaxial growth within S/D regions in accordance with the present invention.
Figure 2B:
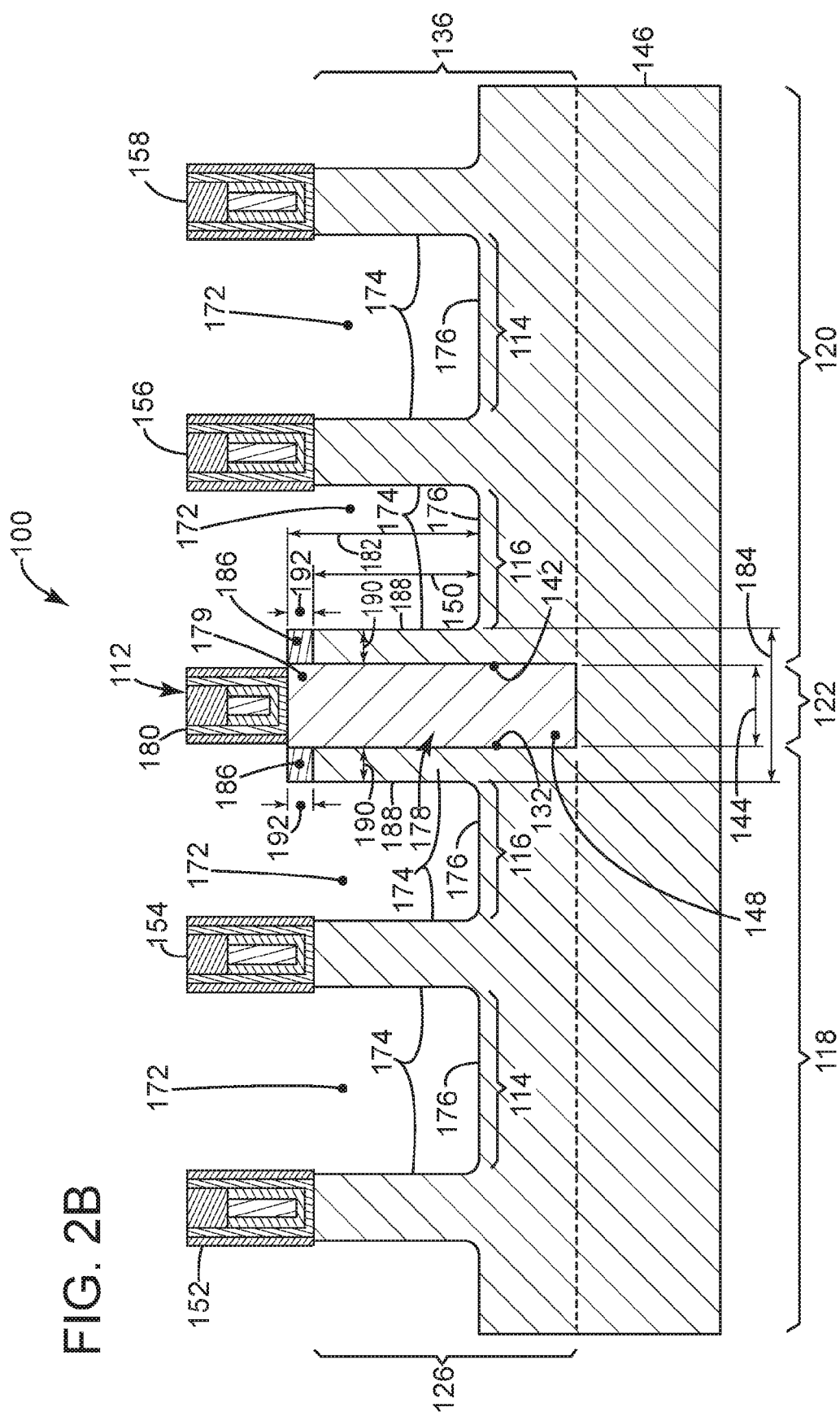
FIG. 2B is a cross sectional view of FIG. 2A taken along the line 2B-2B.
Figure 2C:
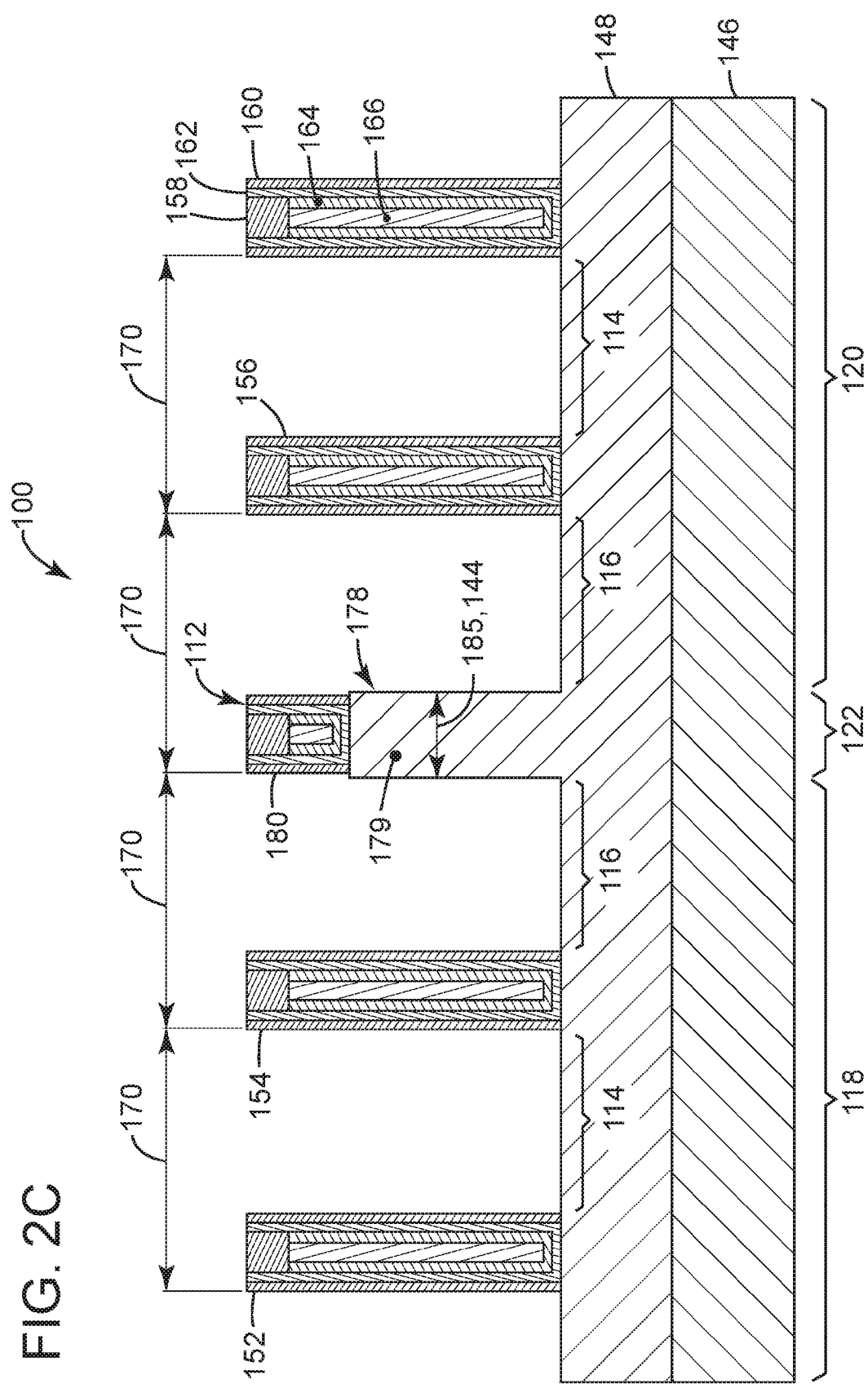
FIG. 2C is a cross sectional view of FIG. 2A taken along the line 2C-2C.

FIGS. 2A-2C illustrate various exemplary embodiments of a structure 100 having a single diffusion break (SDB) 112 in accordance with the present invention, which solves issues associate with the prior art SDB 12. FIGS. 3-10D illustrate various exemplary embodiments of methods of forming SDB 112 for an integrated circuit in accordance with the present invention.

Referring to FIGS. 2A, 2B and 2C, an exemplary embodiment of a structure 100 for an integrated circuit having a single diffusion break (SDB) 112 in accordance with the present invention is presented. FIG. 2A is a perspective view of structure 100 at an intermediate stage of its manufacturing process, just prior to initiation of epitaxial growth within first source/drain (S/D) regions 114 and second S/D regions 116. FIG. 2B is a cross sectional view of FIG. 2A taken along the line 2B-2B, which cuts through fins 126 and 136. FIG. 2C is a cross sectional view of FIG. 2A taken along the line 2C-2C, which cuts a region between the parallel rows of fins. Structure 100 is similar in design to that of prior art structure 10 except for the advanced design of SDB 112.

Structure 100 includes a pair of opposing active first and second Rx regions 118 and 120 respectively, which are separated by an isolation region 122. In this embodiment isolation region 122 is illustrated as a shallow trench isolation (STI) region. Disposed within and over the isolation region 122 is SDB 112, which electrically isolates the Rx regions 118 and 120. A first array 124 of parallel fins 126, 128 and 130 extends longitudinally across first Rx region 118 and is terminated by one side of SDB 112 at first distal ends 132 (best seen in FIG. 2B) of the fins 126, 128, 130. A second array 134 of parallel fins 136, 138, 140 extends longitudinally across second Rx region 120 and is also terminated by an opposing side of SDB 112 at second distal ends 142 (best seen in FIG. 2B) of the fins 136, 138, 140. Though three fins in each Rx region are illustrated in this embodiment, one skilled in the art would recognize that any number of fins can be in each array.

The isolation region 122 has an isolation region width 144 (best seen in FIG. 2B) that is equal to the shortest distance between first distal ends 132 (in first Rx region 118) and second distal ends 142 (in second Rx region 120). The isolation width 144 is designed to prevent leakage current between second S/D regions 116 and is typically in the range of 25 to 35 nm wide. Typically, as illustrated in this embodiment, the isolation region width 144 is constant along the entire length of isolation region 122.

The fins 126, 128, 130, 136, 138 and 140 extend upwards from a semiconductor substrate 146 and through a dielectric layer 148, which is disposed over the semiconductor substrate 146. The dielectric layer may be composed of a flowable oxide (which may be applied as a spin-on Si-oxide followed by an annealing process) or similar material that can provide electrical isolation between active devices. The distance the fins extend above the dielectric layer 148 defines the active fin height 150 of the fins.

Disposed on the dielectric layer 148 and extending laterally over the first fin array 124 are active gates 152 and 154. Disposed on the dielectric layer 148 and extending laterally over the second fin array 134 are active gates 156 and 158. Gates 152, 154, 156 and 158 are representative of any number of gates that extend laterally across each fin array 124 and 134.

In direct contrast to prior art S/D regions 14 and 16, and as will be explained in greater detail herein, S/D regions 114 and 116 have virtually the same geometric shape and volume even though they are bounded by different structures. First S/D regions 114 are bounded between two active gates, and centered over each fin extending through the pair of active gates. Therefore, in this embodiment, there are three first S/D regions 114 bounded between active gate pair 152 and 154, which are centered over fins 126, 128 and 130. Additionally, there are three first S/D regions 114 bounded between active gate pair 156 and 158, which are centered over fins 136, 138 and 140.

On the other hand, second S/D regions 116 are bounded between an active gate and the SDB 112, and are centered over each fin extending therethrough. As such, in this embodiment, there are three second S/D regions 116 bounded between active gate 154 and SDB 112, which are centered over fins 126, 128 and 130. Additionally, there are three second S/D regions 116 bounded between active gate 156 and SDB 112, which are centered over fins 136, 138 and 140.

The structure of the gates 152-158 (as illustrated in FIGS. 2B and 2C) is well known, which typically includes gate spacers 160, gate dielectric 162, gate work-function metal 164 and gate interconnect metal 166. Gates 152-158 wrap around three surfaces of each fin to define a channel region 168 between each S/D region 114, 116. It is important to note that, for optimal performance, the pitch 170 (the distance between repetitive structures) between gates 152-158 and the dummy gate SDB 112, must remain constant. This is because the pitch 170 between gates 152-158 and SDB 112 defines the limits of the epitaxial growth of the S/D regions 114, 116 and for optimal performance, the S/D regions must have substantially equal volumes and be symmetrically shaped.

The first and second S/D regions 114, 116 include the portions of the fins 126, 128, 130, 136, 138 and 140 located between the gates 152-158 and SDB 112. At this stage of the process flow, the active portions of the fins in the S/D regions 114, 116 have been etched down to provide a plurality of generally U shaped, three sided trenches 172. That is, trenches 172 will have two generally vertically extending sides 174 and a bottom side 176. The silicon surfaces of the three sides of trenches 172 provide seeding surfaces for epitaxial growth that will define the total volume of the S/D regions 114, 116.

SDB 112 includes a base 178 and a dummy gate 180 disposed over the top surface of the base 178. The base 178 includes a base raised portion 179 disposed within the isolation region 122. The base raised portion extends upwards from dielectric layer 148 to a base overall height 182 that is greater than the active fin height 150 and extends laterally across the entire isolation region 122. The base raised portion 179 is composed of a dielectric material, such as a flowable oxide material, to electrically isolate the second S/D regions 116 on either side of the SDB 112. In this embodiment, the base raised portion 179 and the dielectric layer 148 are composed of the same dielectric material, though it is possible that they could be composed of different materials.

The base 178 also includes a plurality of base extensions 186 which border on upper side sections of the base raised portion 179 and extend outwardly therefrom. The base extensions 186 extend solely over top surfaces of fin end portions 188 that include the opposing distal ends 132 and 142 of the fins abutting the isolation region 122. As will be explained in greater detail herein, the base extensions 186 are self-aligned with the top surface edges of the fin end portions 188. In this embodiment, the base extensions 186 are composed of a material that is different from that of the base raised portion 179, though it is possible that they could be composed of the same material. More specifically in this embodiment, as will be explained in greater detail herein, the base extensions 186 are composed of portions of a fin hardmask 200 (best seen in FIG. 3) that was used to define the fins and, therefore, self-align the base extensions 186 to the edges of the top surfaces of the fins.

For proper functionality, the base 178 must have an overall height 182 that is greater than the active fin height 150. However, in contrast to prior art base 78 of SDB 12 which has a constant overall width along its entire structure, the base 178 of the present invention has a first overall width 184 (best seen in FIG. 2B) in the regions where the base abuts the distal ends 132, 142 of the fins, and a second overall width 185 (best seen in FIG. 2C) in the regions between the parallel rows of fins. In the regions where the base 178 abuts the distal ends 132, 142 of the fins, the first width 184 must be greater than the isolation width 144. However, in the regions between the parallel rows of fins, the second width 185 can be as narrow as the isolation region width 144.

This is because (best seen in FIG. 2B), in the regions where the base 178 abuts the fins 126, 128, 130, 136, 138, 140, the base 178 includes the plurality of base extensions 186, which tuck over (or extend and cover over) the top surfaces of each end portion 188 of each fin. The base extensions 186 have an extension length 190 and an extension thickness 192.

The extension length 190 of the base extensions 186 must be long enough to protect the fin end portion 188 when the trenches 172 are being etched into the fins. In other words, if base extensions 186 do not tuck over fin end portions 188, then the entire active portions of the fins (up to and including the distal ends 132 and 142 of the fins) in the S/D regions 116 will be etched away during trench 172 formation. Therefore, trenches 172 will only have two silicon seeding surfaces (i.e., a bottom side silicon surface 176 and only a single vertical side silicon surface 174 adjacent the active gates 154 and 156. The vertical side silicon surface 174 that is an integral part of fin end portions 188 will be gone, which will drastically impair epitaxial growth in S/D region 116.

The extension thickness 192 of the base extensions 186 must be wide enough to prevent leakage current from the S/D regions 116 into the dummy gate 180 of SDB 112. This leakage current can occur even though SDB dummy gate 180 is non-functional since it is not disposed over any fins and cannot control current flow through any channel region of an active device. That is because the structure of SDB dummy gate 180 is the same as active gates 152, 154, 156 and 158. Accordingly, the dummy gate 180 will typically include gate spacers 160, gate dielectric 162, gate workfunction metal 164 and gate interconnect metal 166. As a result, it is possible for a leakage current or tunneling current to conduct from the S/D regions 116 into dummy gate 180 if the extension width 192 is not sized properly thick enough.

However, in contrast to the method of making prior art base extensions 86 of SDB 12, the base extensions 186 of the present invention are not formed by a method that is sensitive to the limitations of lithographically patterning. Rather the base extensions 186 are self-aligned with the fin end portions 188 during the formation process. As such, the base extensions 186 are disposed accurately and solely over the narrow widths (generally in the range of about 10 nm) of fin end portions 188 of every fin. Being able to dispose extensions 186 solely over the fins end portions 188 is very advantageous because the extensions 186 only have to protect the fin end portions 188 when the trenches 172 are being etched into the fins and are not required in the regions between the rows of parallel fins.

Therefore, the overall base width 185 between the rows of parallel fins can be reduced to the width 144 of the isolation region 122. Accordingly, the volume of the S/D regions 116 (which are located between SDB 112 and an active gate) can be made substantially equal to the volume of S/D regions 114 (which are located between two active gates). As a result, relative to the prior art, the epitaxial growth in S/D regions 116 is much more robust and the contact area is larger. Additionally, because the placement of the base extensions 186 is self-aligned, the structure 100 is scalable down to the 14 nm FinFET node and beyond.

FIGS. 3-10D illustrate various exemplary embodiments of methods of forming a structure 100 having an SDB 112 for an integrated circuit in accordance with the present invention are presented.

Figure 3:
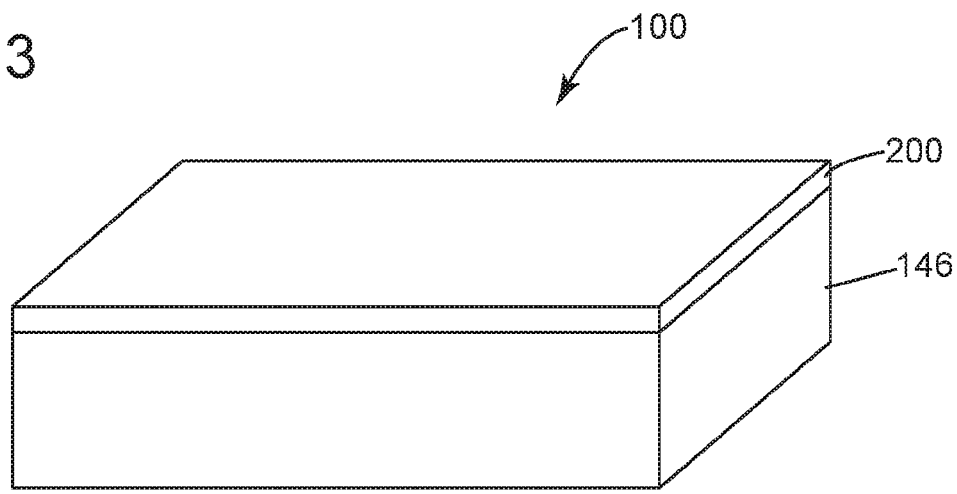
FIG. 3 is a perspective view of the structure of FIG. 1A prior to formation of fin arrays.

Referring to FIG. 3, a perspective view of structure 100 prior to formation of fin arrays 124 and 134 is presented. At this stage of the process flow, structure 100 includes the substrate 146 with a fin hardmask 200 disposed over top of it. Fin hardmask 200 may be a spin-on hardmask (SOH) layer composed of an amorphous carbon or of any appropriate organic/resist type of material. The fin hardmask 200 may also be composed of such material as a silicon nitride or similar. As will be discussed in greater detail herein, portions of the fin hardmask 200 will be formed into the base extensions 186 and, in contrast to prior art base extensions 86, will be self-aligned with the fin end portions 188 that the base extensions 186 are formed upon.

Figure 4:
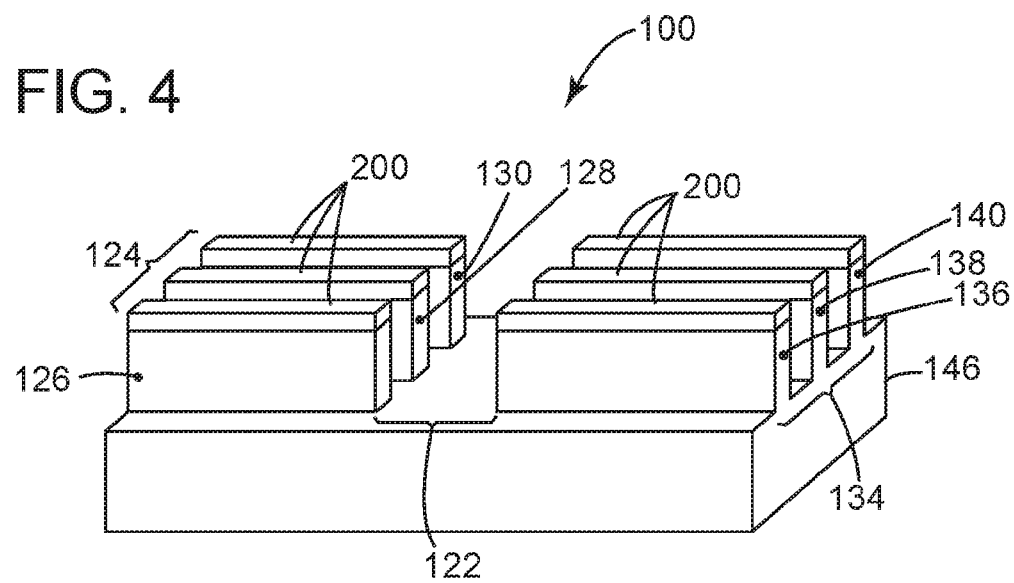
FIG. 4 is a perspective view of the structure of FIG. 3 after the fin arrays are patterned into the substrate.

Referring to FIG. 4, the fin hardmask 200 has been patterned and the structure 100 is anisotropically etched so that the first fin array 124, the second fin array 134 and the isolation region 122 are etched into substrate 146. Because the fin hardmask 200 is used to define the fins 126, 128, 130, 136, 138 and 140 and the isolation region 122, the remaining portions of the fin hardmask 200 that cover over the fins are self-aligned with the edges of the top surfaces of the fins. As such, the alignment of the fin hardmask 200 with the fins is not subject to lithographic tolerances limitations and can be located accurately over the narrow top surfaces of the fins.

Referring to FIGS. 5A, 5B, 5C and 5D an exemplary embodiment of the structure 100 of FIG. 4 having a first dielectric fill material 202 disposed thereon is presented. FIG. 5A is a top view of structure 100. FIGS. 5B, 5C and 5D are various side views of 5A taken along their associated cut lines 5B-5B, 5C-5C and 5D-5D respectively. However, for purposes of clarity in explaining the invention, each side view illustrates only the immediate surface structures cut by each side view's associated cut line and excludes any background structure.

The first dielectric fill material 202 may be composed of, for example, a flowable oxide or other similar material that is capable of providing electrical isolation between active devices. The first dielectric fill material 202 is disposed over the entirety of fin arrays 124 and 134 and planarized down to expose the top surfaces of the fin hardmask 200. The first dielectric fill material 202 may be planarized down using such methods as chemical-mechanical polishing (CMP).

Figure 6C:
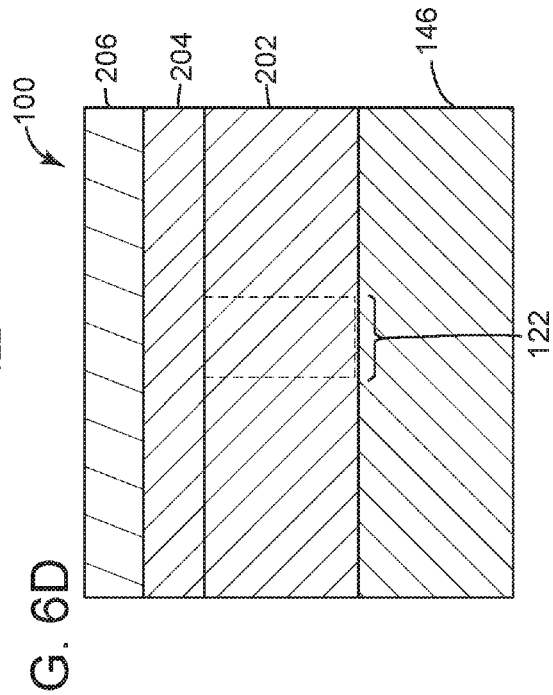
FIG. 6C is a cross sectional view of FIG. 6A taken along the line 6C-6C.
Figure 6D:
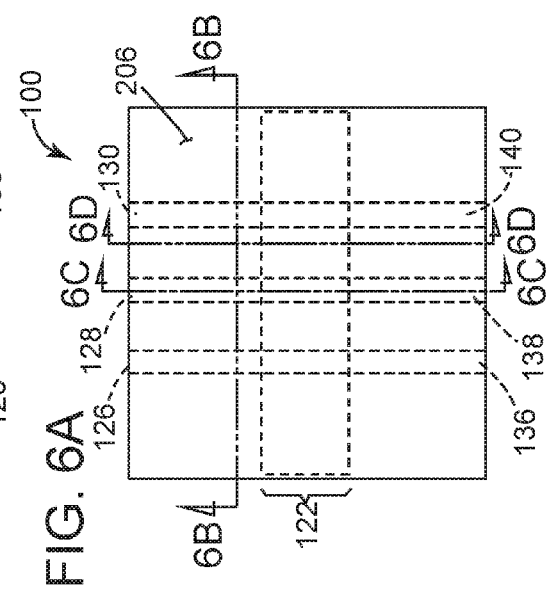
FIG. 6D is a cross sectional view of FIG. 6A taken along the line 6D-6D.
Figure 6B:
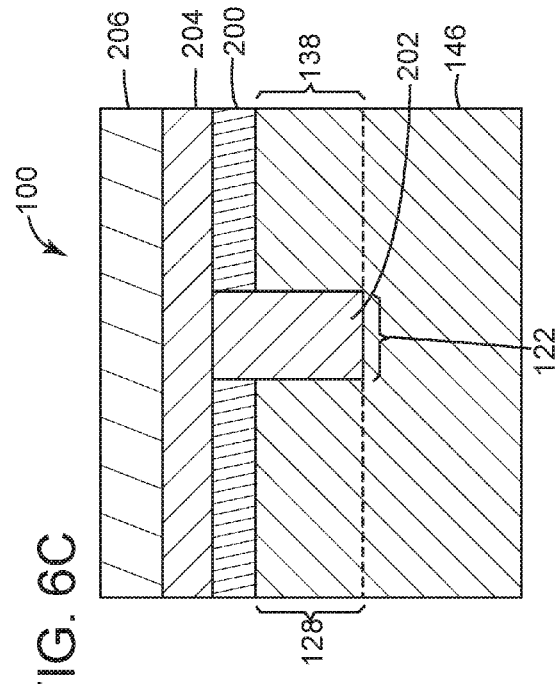
FIG. 6B is a cross sectional view of FIG. 6A taken along the line 6B-6B.
Figure 6A:
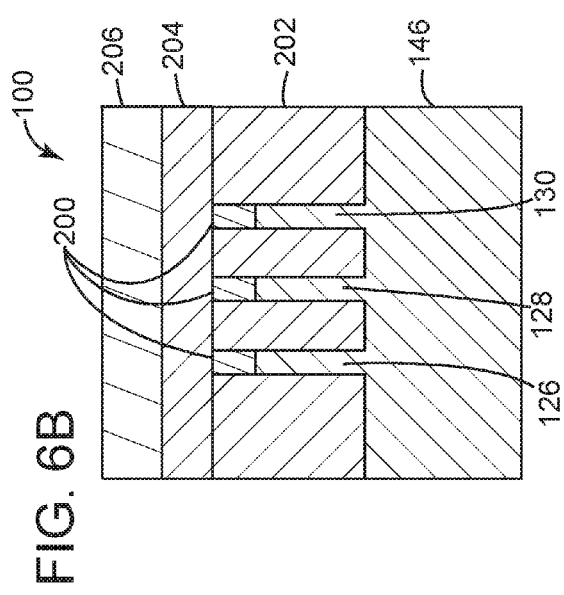
FIG. 6A is a top view of an exemplary embodiment of the structure of FIG. 5A having a second dielectric fill material disposed over the entirety of the first dielectric fill material and a photoresist layer disposed over the second dielectric fill material.

Referring to FIGS. 6A, 6B, 6C and 6D, an exemplary embodiment of the structure 100 of FIGS. 5A-5D having a second dielectric fill material 204 disposed over the entirety of the first dielectric fill material 202 and a photoresist layer 206 disposed over the second dielectric fill material 204 is presented. FIG. 6A is a top view of structure 100. FIGS. 6B, 6C and 6D are various side views of 6A taken along their associated cut lines 6B-6B, 6C-6C and 6D-6D respectively. However, for purposes of clarity in explaining the invention, each side view illustrates only the immediate surface structures cut by each side view's associated cut line and excludes any background structure.

A second dielectric fill material 204 is next disposed over the first dielectric fill material 202 using such well-known methods as chemical vapor deposition (CVD) or atomic layer deposition (ALD). A photo resist layer 206 is then disposed over the second dielectric fill material.

In this embodiment, the second dielectric fill material 204 is composed of the same material as that of the first dielectric fill material 202. However, one skilled in the art would recognize that the first and second dielectric fill materials 204 and 202 may be different. What is important is that both materials provide the electrical isolation required between active devices.

Referring to FIGS. 7A, 7B, 7C and 7D, an exemplary embodiment of the structure 100 of FIGS. 6A-6D after the second dielectric fill material 204 and the photoresist layer 206 have been lithographically patterned and etched is presented. FIG. 7A is a top view of structure 100. FIGS. 7B, 7C and 7D are various side views of 7A taken along their associated cut lines 7B-7B, 7C-7C and 7D-7D respectively. However, for purposes of clarity in explaining the invention, each side view illustrates only the immediate surface structures cut by each side view's associated cut line and excludes any background structure.

After the deposition of the photo resist layer 206, the photo resist layer 206 and the second dielectric fill material 204 are lithographically patterned and etched down to form a photo resist strip 208 and second dielectric strip 210 over the isolation region 122. The second dielectric strip 208 and the photo resist strip 210 have a width 212 that is wider than the width 144 of the isolation region 122. Additionally, the two strips 208 and 210 have a length 214 that extends laterally across the entire isolation region 122. The second dielectric strip 210 and photo resist strip 208 are centered over the isolation region 122 such that they extend over the distal ends of the fins 132, 142 and cover end portions of the fin hardmask 200 which include the base extensions 186.

Referring to FIGS. 8A, 8B, 8C and 8D, an exemplary embodiment of the structure 100 of FIGS. 7A-7D after the fin hardmask 200 has been removed is presented. FIG. 8A is a top view of structure 100. FIGS. 8B, 8C and 8D are various side views of 8A taken along their associated cut lines 8B-8B, 8C-8C and 8D-8D respectively. However, for purposes of clarity in explaining the invention, each side view illustrates only the immediate surface structures cut by each side view's associated cut line and excludes any background structure.

Once the photo resist strip 208 and second dielectric strip 210 have been formed, the structure 100 is selectively anisotropically etched to remove any exposed portions of the fin hardmask 200. The anisotropic etch process may be a reactive ion etching (RIE) process or similar. The remaining end portions of the fin hardmask 200 which are protected by the photo resist layer 208 form the base extensions 186 of the base 178 of SDB 112.

Referring to FIGS. 9A, 9B, 9C and 9D, an exemplary embodiment of the structure 100 of FIGS. 8A-8D after the first dielectric material has been etched down to expose the active portion of the fins and to complete formation of base 178 is presented. FIG. 9A is a top view of structure 100. FIGS. 9B, 9C and 9D are various side views of 9A taken along their associated cut lines 9B-9B, 9C-9C and 9D-9D respectively. However, for purposes of clarity in explaining the invention, each side view illustrates only the immediate surface structures cut by each side view's associated cut line and excludes any background structure.

The photo resist strip 208 is next removed by any number of wet or dry etching processes to expose the second dielectric strip 210. Thereafter, both the first dielectric fill material 202 and the second dielectric strip 210 are isotropically etched in both the vertical and horizontal directions at known vertical and horizontal etch rates, using various well-known wet etching processes. The isotropic etching process is used to accomplish several tasks simultaneously, including:

recessing the height of the first dielectric fill material 202 to expose the active fin height 150 of fins 126, 128, 130, 136, 138 and 140 and form the dielectric layer 148 (best seen in FIG. 9B);

removing the second dielectric strip 210 to expose the base extensions 186 of base 178 (best seen in FIG. 9C);

recessing the height of the first dielectric fill material 202 to expose the base raised portion 179 of base 178 at its full base height 182 in the isolation region 122 (best seen in FIG. 9D); and reducing the overall width of the exposed base 178 in the regions between parallel rows of fins to that of the isolation region width 144, therefore completing the formation of base 178 (best seen in FIG. 9D).

Referring to FIGS. 10A, 10B, 10C and 10D, an exemplary embodiment of the structure 100 of FIGS. 9A-9D after the dummy gate 180 is disposed over base 178 is presented. FIG. 10A is a top view of structure 100. FIGS. 10B, 10C and 10D are various side views of 10A taken along their associated cut lines 10B-10B, 10C-10C and 10D-10D respectively. However, for purposes of clarity in explaining the invention, each side view illustrates only the immediate surface structures cut by each side view's associated cut line and excludes any background structure.

Once the formation of the base 178 is complete and the active fins 126, 128, 130, 136, 138 and 140 have been exposed, oxide layer 216 and the active gates 152, 154, 156 and 158 can be disposed over the fins per well-known methods. Simultaneously, the dummy gate 180 can be disposed over the base 178 to complete the formation of SDB 112.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A structure having a single diffusion break, the structure comprising:
   a substrate;
   a dielectric layer disposed over the substrate;
   a first array of fins having first distal ends and a second array of fins having second distal ends extending upwards from the substrate through the dielectric layer;
   an isolation region separating the first and second array of fins wherein the first and second distal ends abut opposing sides of the isolation region; and
   a single diffusion break (SDB) disposed in the isolation region, the SDB having:
      a base having a base raised portion extending upwards from the dielectric layer, and a plurality of base extensions extending solely over top surfaces of fin end portions of the fins abutting the isolation region, the base extensions being self-aligned with all edges of the top surfaces of fin end portions in the first and second array of fins, and
      a dummy gate disposed over a top of the base.

2. The structure of claim 1 comprising:
   the fins of the first and second fin arrays having an active fin height defined by the distance the fins extend above the dielectric layer; and
   the base includes a base height greater than the active fin height.

3. The structure of claim 1 comprising:
   the base having a first base width in regions where the base abuts the distal ends of the fins; and
   a second base width smaller than the first base width in regions between parallel rows of fins.

4. The structure of claim 3 comprising:
   the first base with equal to a width of the isolation region plus a length of each base extension extending over the fins in that region; and
   the second base width equal to the width of the isolation region.

5. The structure of claim 1 comprising the base extensions and the based raised portion being composed of different materials.

6. The structure of claim 1 wherein the base extensions are portions of a fin hardmask used to define the fins.

7. The structure of claim 1 wherein the base raised portion is composed of the same material as the dielectric layer.

8. The structure of claim 7 wherein the base raised portion and the dielectric layer are composed of a flowable oxide.

9. The structure of claim 1 comprising:
   a plurality of active gates disposed on the dielectric layer and extending laterally over the first and second fin arrays;
   a first source/drain (S/D) region bounded by a pair of active gates; and
   a second S/D region bounded by an active gate and the SDB.

10. The structure of claim 9 wherein the volumes of the first and second S/D regions are substantially equal.

* * * * *